(12) United States Patent
Hsieh et al.

(10) Patent No.: US 7,423,319 B2
(45) Date of Patent: Sep. 9, 2008

(54) LDPMOS STRUCTURE WITH ENHANCED BREAKDOWN VOLTAGE

(75) Inventors: Robin Hsieh, Hsin Chu (TW); Tsai Chun Lin, Hsin-Chu (TW); Albert Yao, Hsin-Chu (TW); Pai-Kang Hsu, Hsin-Chu (TW); Tsung-Yi Huang, Hsin-Chu (TW); Ruey-Hsin Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 53 days.

(21) Appl. No.: 11/646,683

(22) Filed: Dec. 28, 2006

(65) Prior Publication Data
US 2008/0157197 A1 Jul. 3, 2008

(51) Int. Cl.
*H01L 29/78* (2006.01)
(52) U.S. Cl. .................. 257/335; 257/339; 257/371; 257/E29.256; 438/286
(58) Field of Classification Search ............ 257/371, 257/335, 339, E29.256; 438/286
See application file for complete search history.

(56) References Cited

U.S. PATENT DOCUMENTS

2004/0129983 A1* 7/2004 Mallikarjunaswamy ..... 257/370

* cited by examiner

*Primary Examiner*—Evan Pert
*Assistant Examiner*—Tan N Tran
(74) *Attorney, Agent, or Firm*—Slater & Matsil, L.L.P.

(57) ABSTRACT

A semiconductor structure includes a first well region of a first conductivity type overlying a substrate, a second well region of a second conductivity type opposite the first conductivity type overlying the substrate and laterally adjoining the first well region, a third well region of the second conductivity type adjacent and spaced apart from the first well region, a first deep well region of the second conductivity type underlying at least portions of the first and the second well regions, a second deep well region of the second conductivity type underlying the third well region and spaced apart from the first deep well region, an insulation region in the first well region, a gate dielectric extending from over the insulation region to over the second well region, and a gate electrode on the gate dielectric.

24 Claims, 13 Drawing Sheets

LDPMOS STRUCTURE WITH ENHANCED BREAKDOWN VOLTAGE

TECHNICAL FIELD

This invention relates generally to semiconductor devices, and more particularly to metal-oxide-semiconductor (MOS) devices, and even more particularly to the structure and manufacturing methods of high-voltage MOS devices.

BACKGROUND

High-voltage metal-oxide-semiconductor (HVMOS) devices are widely used in many electrical devices, such as input/output (I/O) circuits, CPU power supplies, power management systems, analog/digital converters, etc. There are a variety of types of HVMOS devices. Lateral diffused MOS (LDMOS) devices are among the most commonly used HVMOS devices. LDMOS devices typically include laterally diffused drain regions, which enclose drain regions. Laterally diffused drain regions typically have lower doping concentrations than the drain regions, thus have high breakdown electrical fields.

FIG. 1 illustrates a conventional LDPMOS device 2, which includes gate oxide 10, gate electrode 12 on gate oxide 10, drain region 6 in low-voltage p-well (LVPW) region 4, and source region 8 in low-voltage n-well (LVNW) region 7. Shallow trench isolation (STI) region 14 spaces drain region 6 and gate electrode 12 apart so that a high drain-to-gate voltage can be applied. LDPMOS device 2 may be encircled by an isolation ring, which includes an LVNW regions 7, 16 and the corresponding pick-up regions 18. Deep n-well (DNW) region 20 is typically formed underlying LVPW region 4 and LVNW regions 7 and 16 for isolation purposes.

Typically, the isolation ring is applied with a voltage of zero volts. Therefore, when a high voltage is applied on drain region 6, the same high voltage is applied between drain region 6 and LVNW region 16. In region 22, which is an interface region between LVPW region 4, LVNW region 16 and DNW region 20, a high electrical field is generated. The formation of the high electrical field causes the reduction in breakdown voltage of LDPMOS 2. Typically, LDPMOS devices, as shown in FIG. 1, can be operated under high voltages of up to about 12 volts without being broken down. However, LDPMOS devices are often required to be operated under voltages of 16 volts or higher. Therefore, the structure of LDPMOS devices needs to be improved.

SUMMARY OF THE INVENTION

In accordance with one aspect of the present invention, a semiconductor structure includes a first well region of a first conductivity type overlying a substrate, a second well region of a second conductivity type opposite the first conductivity type overlying the substrate and laterally adjoining the first well region, a third well region of the second conductivity type adjacent the first well region, wherein the second and the third well regions are spaced apart from each other, a first deep well region of the second conductivity type underlying at least portions of the first and the second well regions, a second deep well region of the second conductivity type underlying the third well region, wherein the second deep well region encloses at least portions of the sidewalls and the bottom of the third well region, and wherein the first and the second deep well regions are spaced apart by a spacing, an insulation region in a portion of the first well region and extending from a top surface of the first well region into the first well region, a gate dielectric extending from over the first well region to over the second well region, wherein the gate dielectric has a portion over the insulation region, and a gate electrode on the gate dielectric.

In accordance with another aspect of the present invention, a semiconductor structure includes a substrate, a first well region of a first conductivity type overlying the substrate, a second well region of a second conductivity type opposite the first conductivity type overlying the substrate and laterally adjoining the first well region, a third well region of the second conductivity type adjacent the first well region, wherein the second and the third well regions are spaced apart from each other by a spacing, a deep well region of the second conductivity type underlying the first, the second and the third well regions, wherein a portion of the deep well region directly underlying the spacing has a first impurity concentration, and wherein portions of the deep well region directly underlying the first and the second well regions have a second impurity concentration, and wherein the first impurity concentration is less than the second impurity concentration, an insulation region in a portion of the first well region and extending from a top surface of the first well region into the first well region, a gate dielectric extending from over the first well region to over the second well region, wherein the gate dielectric has a portion over the insulation region, and a gate electrode on the gate dielectric.

In accordance with yet another aspect of the present invention, a semiconductor structure includes a semiconductor substrate, a first low-voltage p-well (LVPW) region overlying the substrate, a first low-voltage n-well (LVNW) region overlying the substrate and laterally adjoining the first LVPW region, a second LVNW region overlying the substrate and encircling the first LVNW region and the first LVPW region, wherein the second LVNW region is spaced apart from the first LVNW region and the first LVPW region, a first deep n-well (DNW) region underlying at least portions of the first LVNW region and the first LVPW region, a second DNW region underlying the second LVNW region and laterally spaced apart from the first DNW region; an insulation region in the first LVPW region, the insulation region having a top surface substantially level with a top surface of the first LVPW region, a gate dielectric extending from over the insulation region to over the first LVNW region, a gate electrode on the gate dielectric, a drain region in the first LVPW region and adjacent the insulation region, and a source region in the first LVNW region and adjacent the gate dielectric.

In accordance with yet another aspect of the present invention, a method for forming a semiconductor structure includes providing a substrate, forming a first well region of a first conductivity type overlying the substrate, forming a second well region of a second conductivity type overlying the substrate and laterally adjoining the first well region, wherein the second conductivity type is opposite the first conductivity type, forming a third well region of the second conductivity type adjacent the first well region, wherein the second and the third well regions are spaced apart from each other, forming a first deep well region of the second conductivity type underlying at least portions of the first and the second well regions, forming a second deep well region of the second conductivity type underlying the third well region, wherein the first and the second deep well regions are spaced apart by a spacing, forming an insulation region in a portion of the first well region and extending from a top surface of the first well region into the first well region, forming a gate dielectric extending from over the first well region to over the second well region, wherein the gate dielectric has a portion over the insulation region, and forming a gate electrode on the gate dielectric.

The advantageous features of the present invention include increased breakdown voltage.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The preferred embodiments of the present invention are described with reference to FIGS. 2 through 8, and variations of the preferred embodiments are then discussed. Throughout the various views and illustrative embodiments of the present invention, like reference numbers are used to designate like elements.

Figure 1:
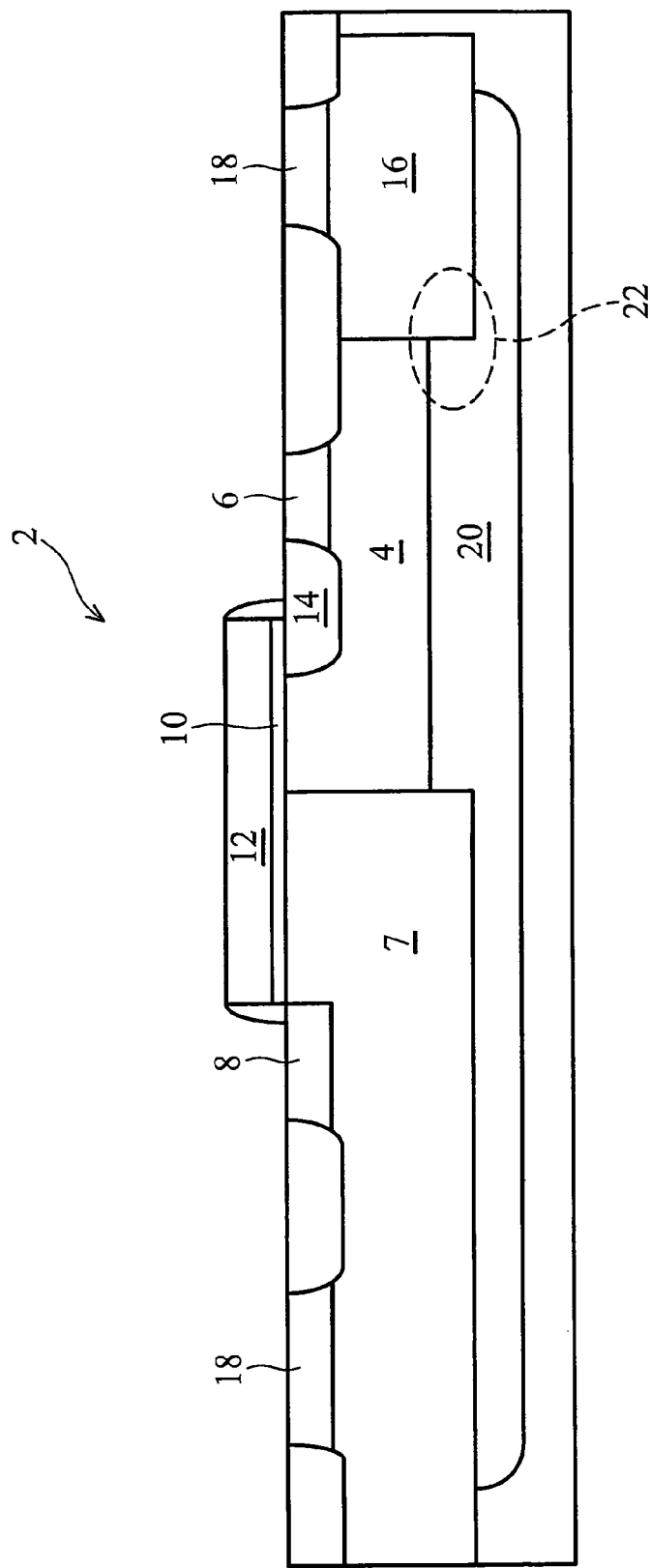
FIG. 1 illustrates a conventional high-voltage p-type MOS (HVPMOS) device.
Figure 2:
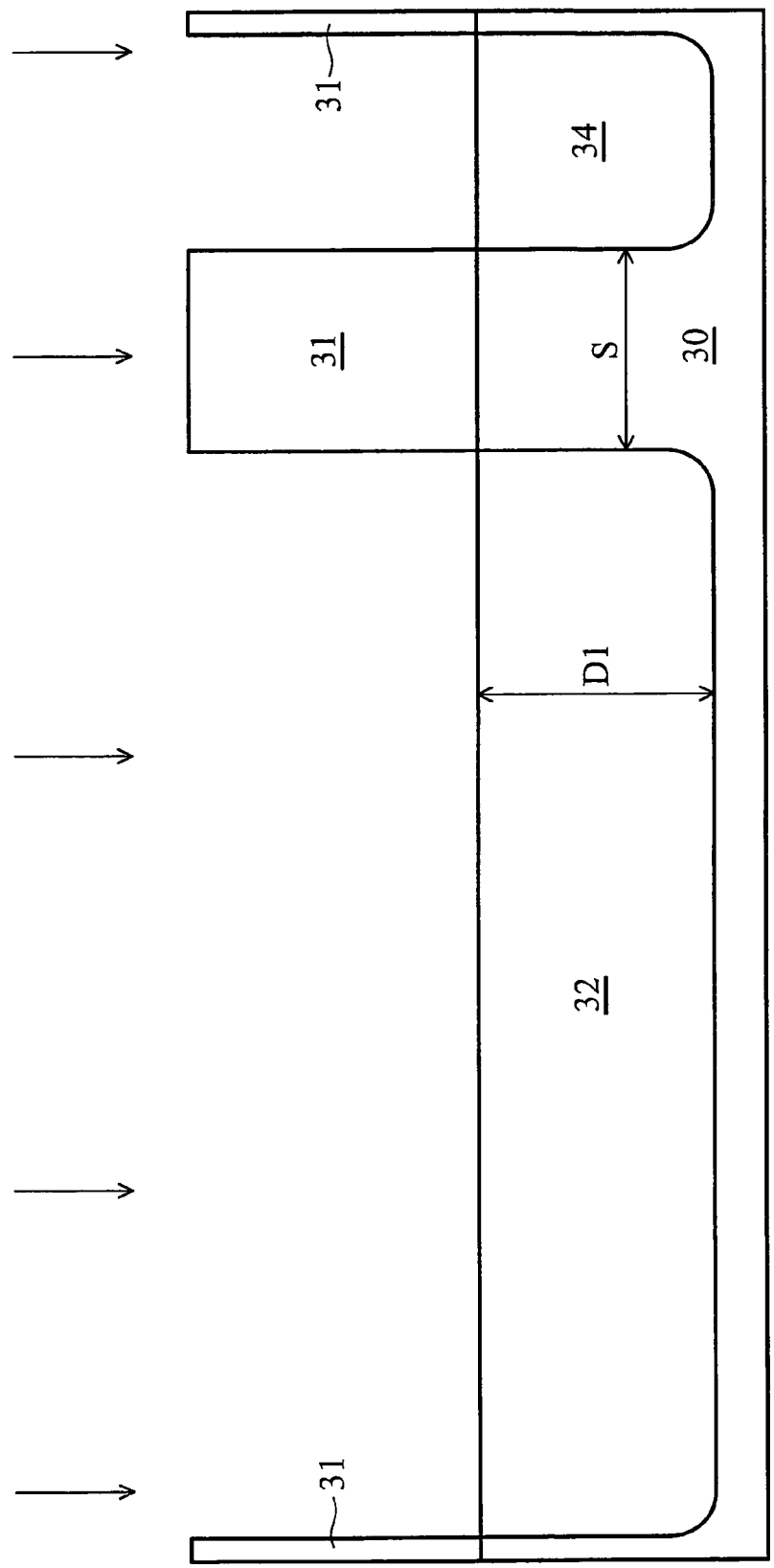
FIGS. 2 through 8 are cross-sectional views of intermediate stages in the manufacturing of an HVPMOS device.

Referring to FIG. 2, substrate 30 is provided. Substrate 30 preferably includes a semiconductor material such as silicon. In other embodiments, other commonly used semiconductor materials such as silicon-germanium (SiGe) may be used. Preferably, substrate 30 is lightly doped with a p-type impurity, although it can also be doped with n-type impurities.

Photoresist 31 is formed and patterned using lithography techniques. Deep n-well (DNW) regions 32 and 34 are then formed. DNW regions 32 and 34 are preferably doped with n-type impurities, such as phosphorous and/or arsenic. Preferably, the n-type impurity concentration in DNW regions 32 and 34 is at least one order higher than the p-type impurity concentration in substrate 30. DNW regions 32 and 34 are spaced apart from each other with a spacing therebetween. As will be discussed in detail in the subsequent paragraphs, width S of the spacing affects the breakdown voltage of the resulting high-voltage metal-oxide-semiconductor (HVMOS) devices. Photoresist 31 is then removed.

Figure 3:
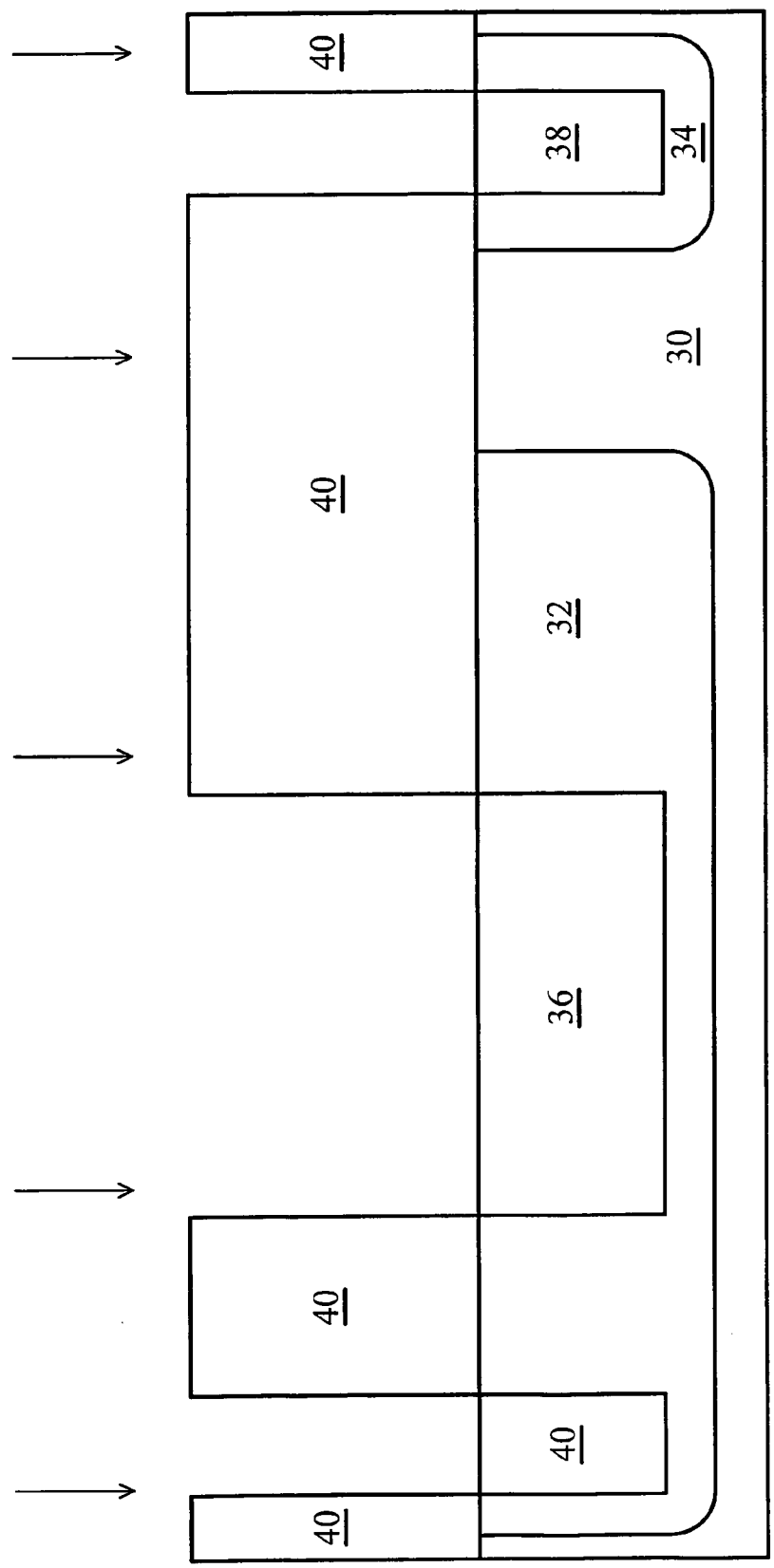

FIG. 3 illustrates the formation and pattering of photoresist 40 and the formation of n-well regions 36, 38 and 40. In the preferred embodiment, n-well regions 36, 38 and 40 are implanted with an n-type impurity, such as phosphorous and/or arsenic. Preferably, the n-type impurity concentration in n-well regions 36, 38 and 40 is greater than the n-type impurity concentration in DNW regions 32 and 34. In the preferred embodiment, n-well regions 36, 38 and 40 are low-voltage n-well (LVNW) regions that are formed simultaneously with the formation of the n-well regions of low-voltage devices (not shown), such as core p-type MOS (PMOS) or memory PMOS devices. Accordingly, n-well regions 36, 38 and 40 have a same depth and a same concentration as the corresponding LVNW regions formed for low-voltage circuits. For simplicity, n-well regions 36, 38 and 40 are alternatively referred to as LVNW regions 36, 38 and 40 throughout the description. It is to be appreciated, however, that n-well regions 36, 38 and 40 may be formed separately from the formation of low-voltage well regions. In other embodiments, n-well 36, 38 and 40 may be high-voltage well regions, which preferably have a lower impurity concentration than the LVNW regions. Please note that although LVNW regions 38 and 40 appear to be two separate regions in the cross-sectional view, they can also be portions of a continuous isolation ring encircling LVNW region 36. After the formation of LVNW regions 36, 38 and 40, photoresist 40 is removed.

Figure 4:
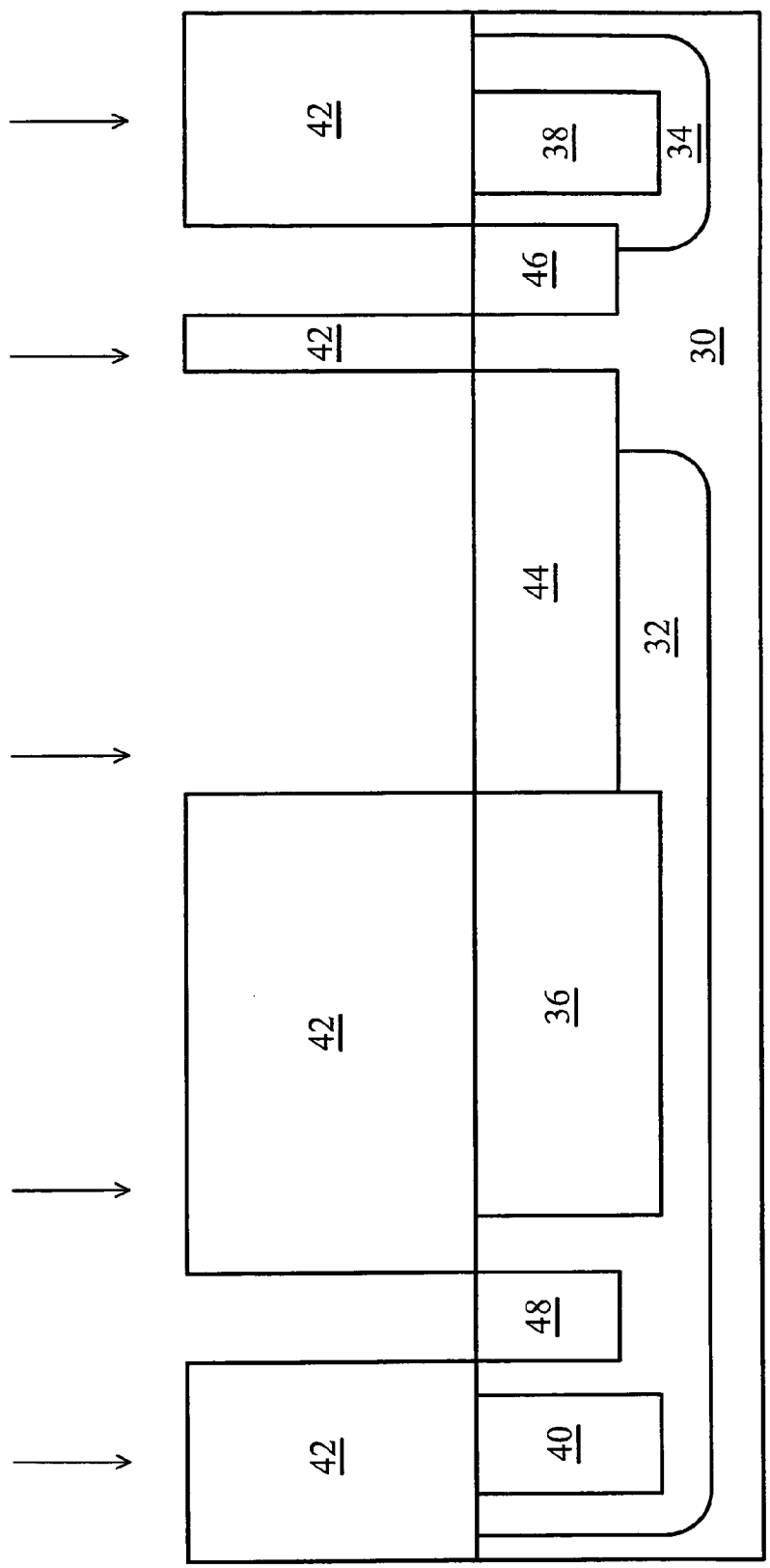

Referring to FIG. 4, photoresist 42 is formed, and p-well regions 44, 46 and 48 are formed. P-well regions 44, 46 and 48 are preferably implanted with a p-type impurity, such as boron and/or indium. Preferably, the p-type impurity concentration in p-well regions 44, 46 and 48 are greater than the p-type impurity concentration in DNW regions 32 and 34. In the preferred embodiment, p-well regions 44, 46 and 48 are low-voltage p-well (LVPW) regions that are formed simultaneously with the formation of the p-well regions of low-voltage devices (not shown), such as core n-type MOS (NMOS) and/or memory NMOS devices. Accordingly, p-well regions 44, 46 and 48 have a same depth and a same concentration as the corresponding LVPW regions formed for low-voltage circuits. For simplicity, p-well regions 44, 46 and 48 are alternatively referred to as LVPW regions 44, 46 and 48 throughout the description. It is to be appreciated, however, that p-well regions 44, 46 and 48 may be formed separately from the formation of low-voltage well regions. In other embodiments, p-well regions 44, 46 and 48 may be high-voltage well regions, which have a higher impurity concentration than the LVPW regions. P-well regions 44, 46 and 48 preferably have an impurity concentration comparable to the impurity concentration in LVNW regions 36, 38 and 40. Although LVPW regions 46 and 48 appear to be two separate regions in the cross-sectional view, they may be portions of a continuous LVPW ring. In alternative embodiments, LVPW region 48 is not formed, and LVPW region 46 is formed as a strip. After the formation of LVPW regions 44, 46 and 48, photoresist 42 is removed. One skilled in the art will realize that the order for forming regions LVNW regions 36, 38 and 40 and LVPW regions 44, 46 and 48 is merely a design choice.

Figure 5A:
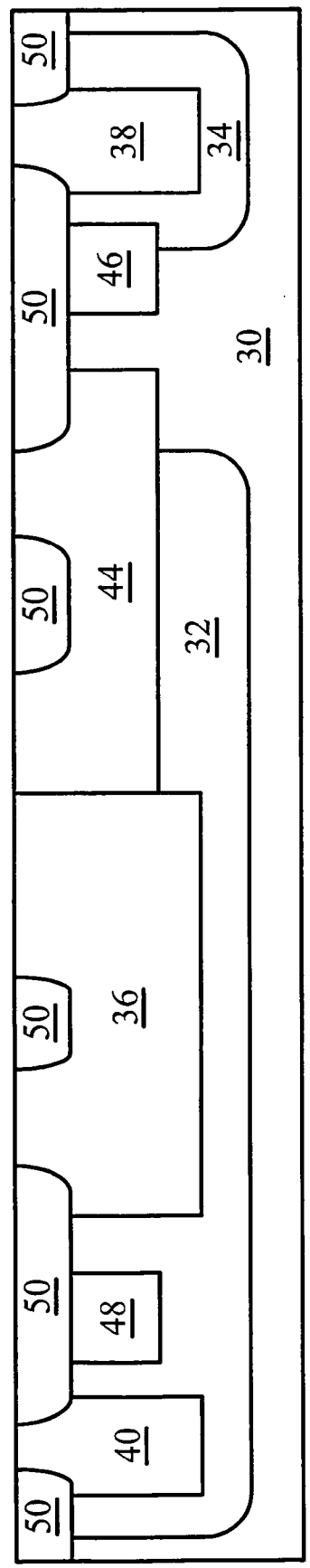
Figure 5B:
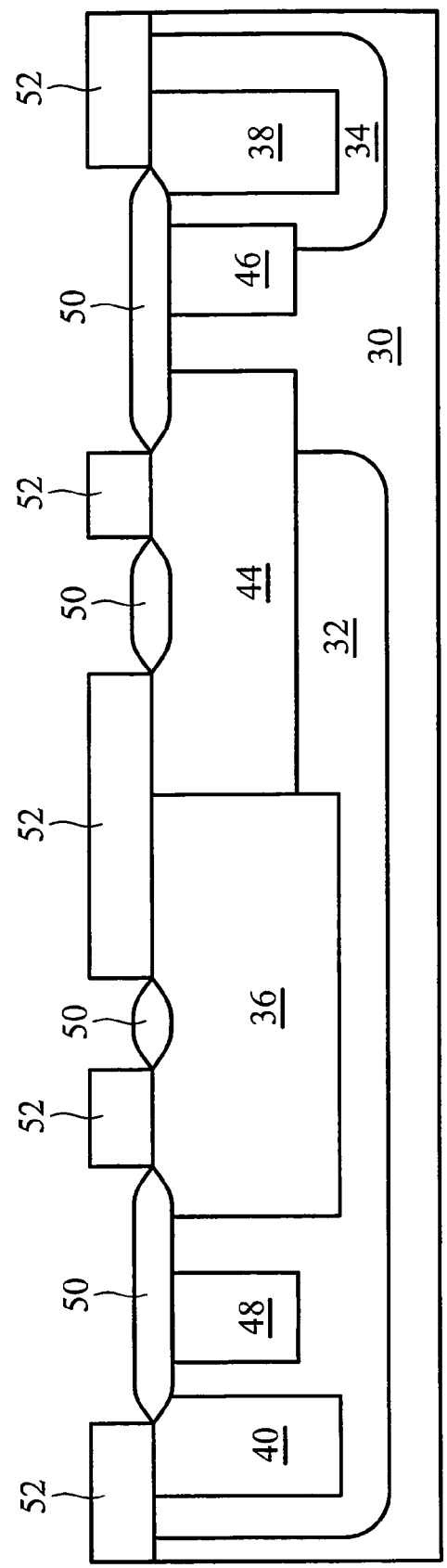

FIGS. 5A and 5B illustrate the formation of insulation regions 50. In the preferred embodiment, as is shown in FIG. 5A, insulation regions 50 are formed by forming trenches, filling the trenches with a dielectric material, such as $SiO_2$ or high-density plasma (HDP) oxide, and performing a chemical mechanical polish to level the surface of the dielectric material to a top surface of substrate 30. The resulting shallow trench isolation (STI) regions are insulation regions 50. In other embodiments, as shown in FIG. 5B, a mask layer 52, preferably formed of SiN, is formed over the previously formed structure. Mask layer 52 is then patterned to form openings. An oxidation is then performed, and insulation regions (also referred to as field oxides) 50 are formed in the openings. Typically, for 0.25 μm technology and under, insulation regions are preferably STI regions. For technologies with greater scale, field regions are preferably field oxides.

Figure 6:
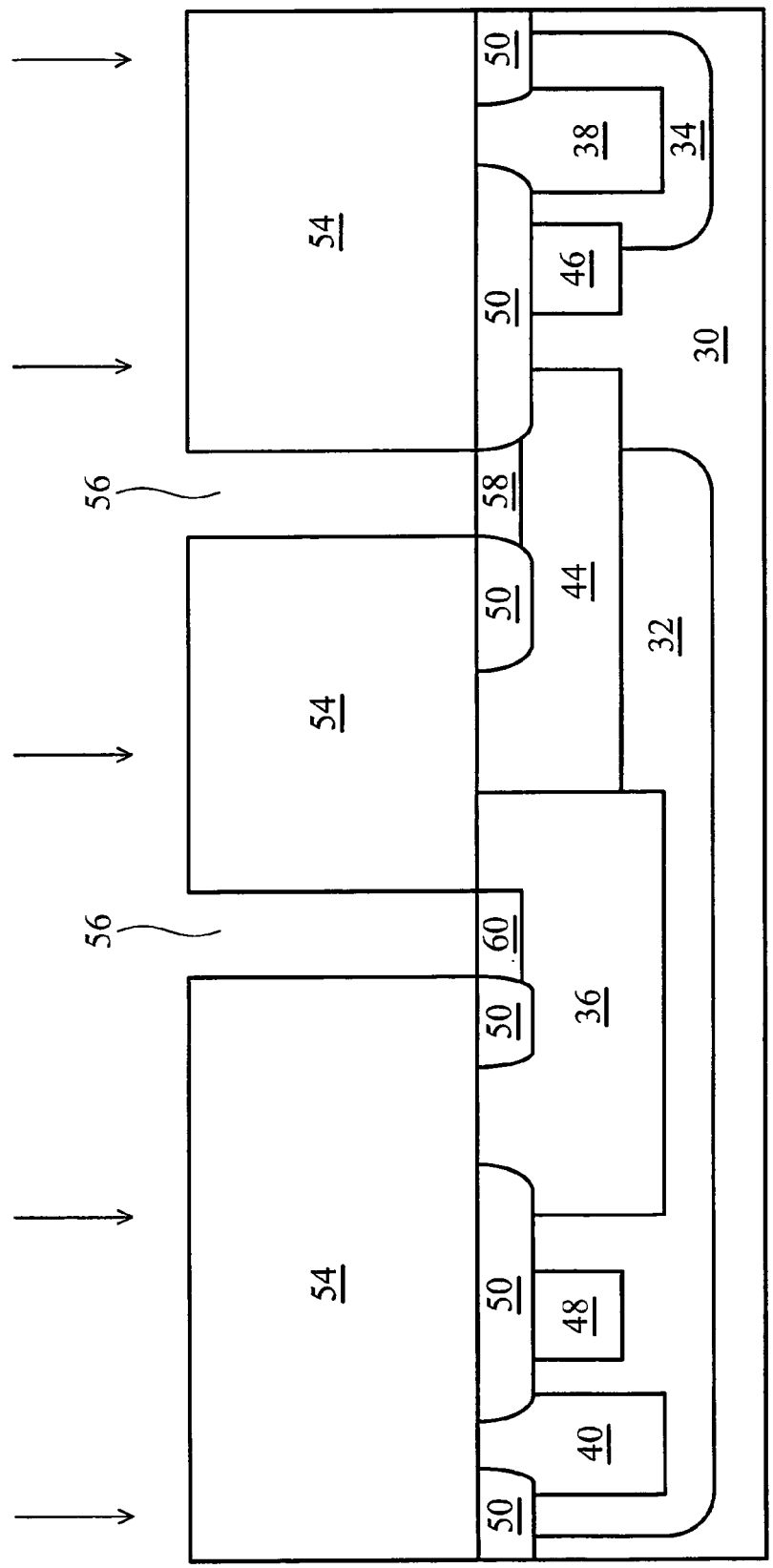

Referring to FIG. 6, photoresist 54 is applied and patterned, forming openings 56. A p-type impurity implantation is performed, forming P+ regions 58 in LVPW region 44 and P+ region 60 in LVNW region 36. Preferably, P+ regions 58 and 60 comprise boron and/or other p-type impurities and are heavily doped to a concentration of greater than about $10^{20}/cm^3$. P+ regions 58 and 60 act as a drain contact region and source region, respectively. Photoresist 54 is then removed.

Figure 7:
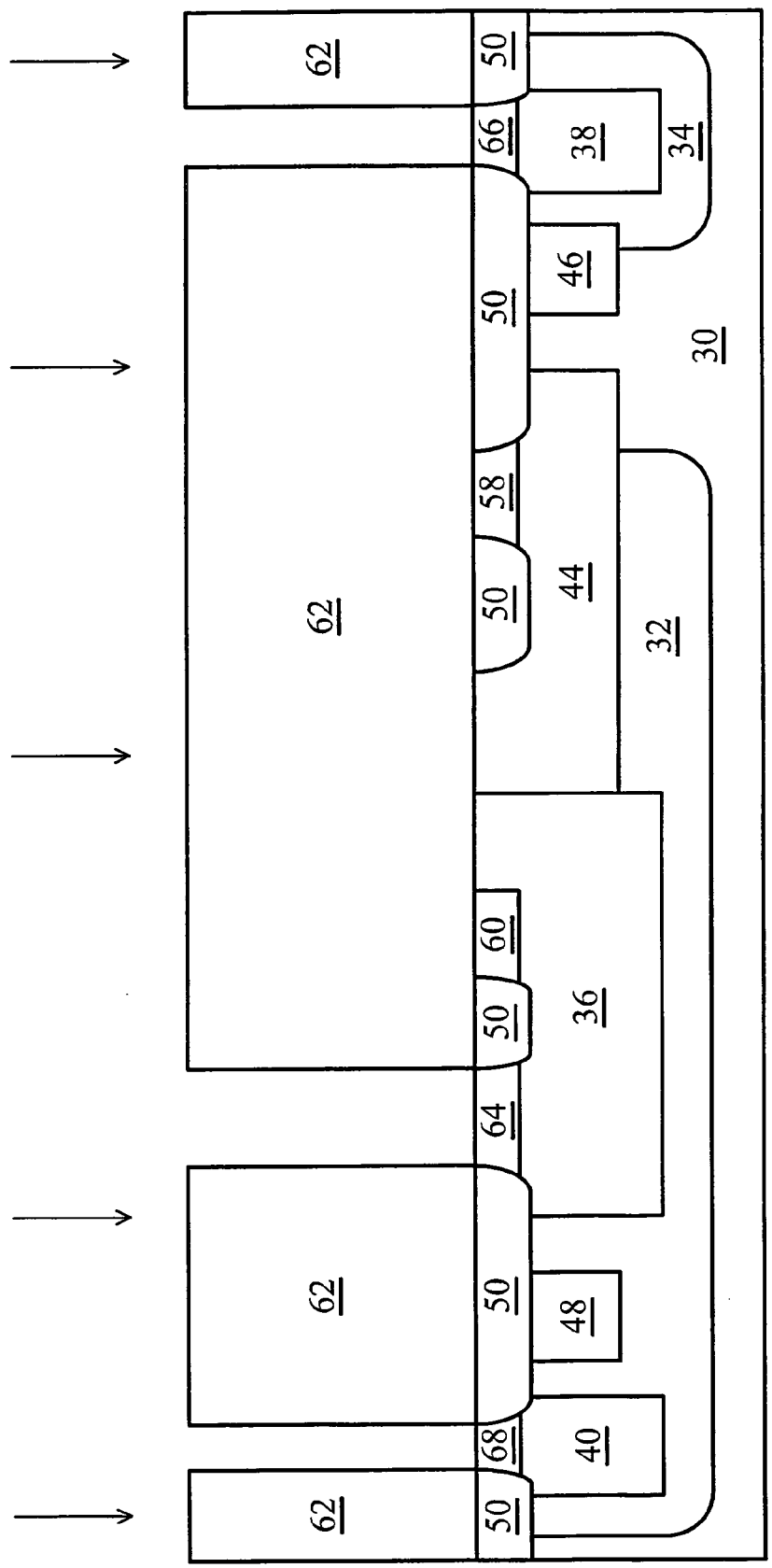

Referring to FIG. 7, photoresist 62 is applied and patterned, and an n-type impurity implantation is performed, forming N+ regions 64, 66 and 68. The N+ impurity may comprise phosphorus and/or arsenic. Preferably, the n-type impurity is heavily doped to a concentration of greater than about $10^{20}/cm^3$. N+ regions 66 and 68 are pick-up regions of the insulation regions 38 and 40, respectively. After the implantation, photoresist 62 is removed.

Alternatively, N+ regions 64, 66 and 68 may be formed before the formation of P+ regions 58 and 60, or formed after the formation of the subsequently formed gate dielectric, gate electrode and gate spacers. One skilled in the art will realize the respective process steps.

Figure 8:
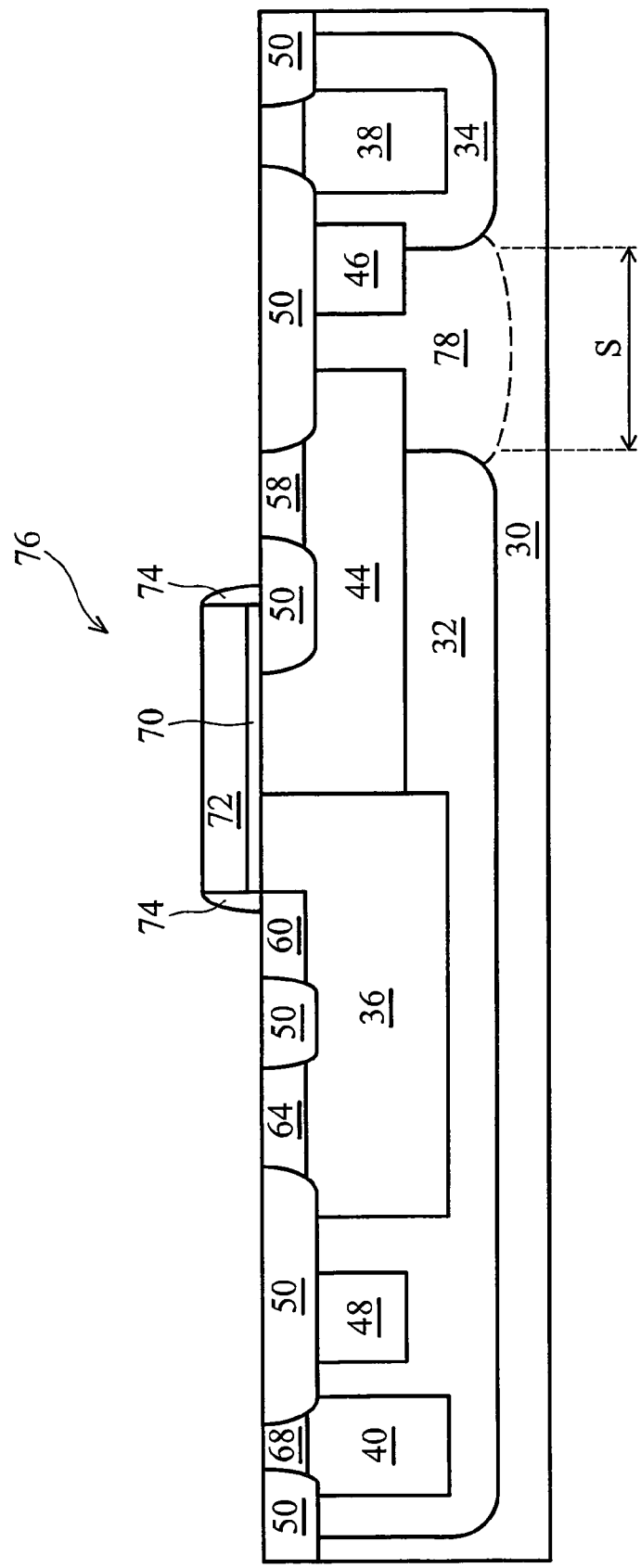

FIG. 8 illustrates the formation of gate dielectric 70, gate electrode 72 and gate spacers 74. As is known in the art, gate dielectric 70 preferably comprises silicon oxide, although other dielectric materials such as silicon nitride, silicon carbide, silicon oxynitride, combinations thereof, and multi-layers thereof, can be used. Gate electrode 72 preferably includes doped polysilicon. Alternatively, metals, metal nitrides, metal silicides, and other conductive materials can be used. Gate spacers 74 are preferably formed by blanket forming a dielectric material, and removing undesired portions from horizontal surfaces. The details of formation processes of gate dielectric 70, gate electrode 72 and gate spacers 74 are well known in the art, and thus are not repeated herein. Preferably, a side edge of gate electrode 72 is located over insulation region 50. HVPMOS device 76 is thus formed.

Subsequently, HVPMOS device 76 will go through annealing processes, which causes the impurities in DNW regions 32 and 34 to diffuse toward substrate region 78, which is between DNW regions 32 and 34. As a result, in the final structure, DNW regions 32 and 34 may not have a clear boundary. However, region 78 will have a lower p-type impurity concentration (the first impurity concentration) than DNW regions 32 and 34. The first p-type impurity concentration tends to be lower than about one half of a second p-type impurity concentration in DNW regions 32 and 34. It is also likely the second p-type impurity concentration is greater than the first p-type impurity concentration by about one order (ten times) or greater. In an exemplary embodiment, the second impurity concentration is in the order of $1E16/cm^3$, while the first impurity concentration is in the order of about $1E15/cm^3$.

An advantageous feature of the present invention is that DNW regions 32 and 34 are separated from each other. In addition, LVPW region 44 is now separated from LVNW region 38. As a result, substrate region 78 has lower p-type and n-type impurity concentrations. The highly concentrated electrical fields are thus spread out, and thus the breakdown voltage of HVPMOS device 76 is increased. It is realized that the breakdown voltage of HVPMOS device 76 is related to the width S of region 78. With the increase in width S, the breakdown voltage of HVPMOS device 76 tends to increase. In the sample HVPMOS devices formed using the embodiments of the present invention, breakdown voltages of between about 22.5 volts and about 30 volts have been observed.

Figure 9:
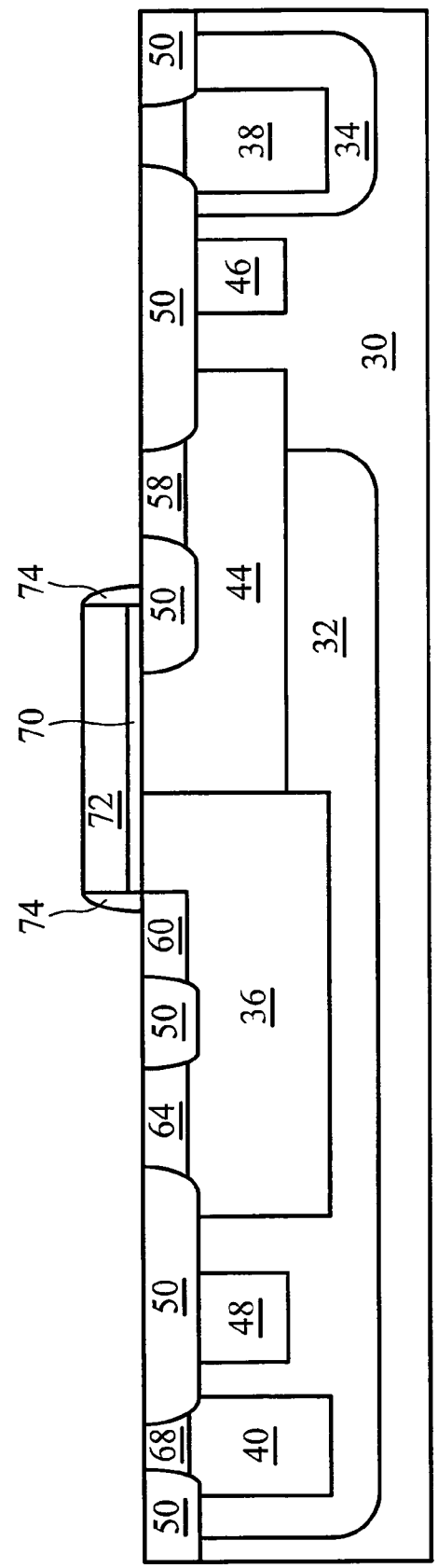
FIGS. 9 and 10 illustrate variations of the preferred embodiment.
Figure 10:
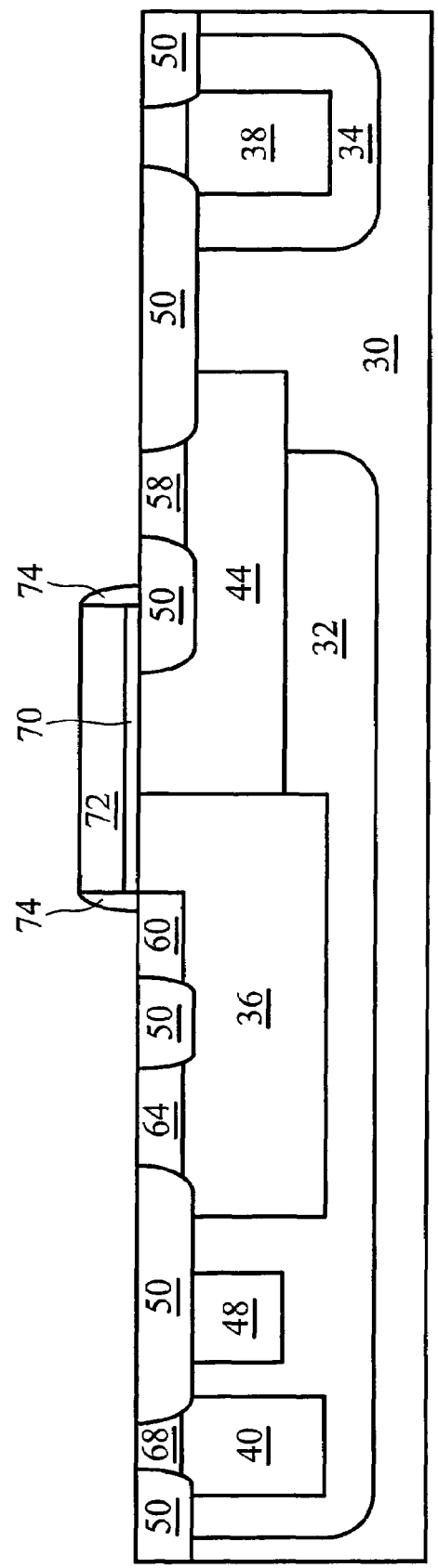

FIGS. 9 and 10 illustrate alternative embodiments of the present invention. In FIG. 9, LVPW region 46 is formed between LVPW region 44 and DNW region 34, with an additional spacing between LVPW region 46 and DNW region 34. In FIG. 10, LVPW region 46 is not formed.

Figure 11:
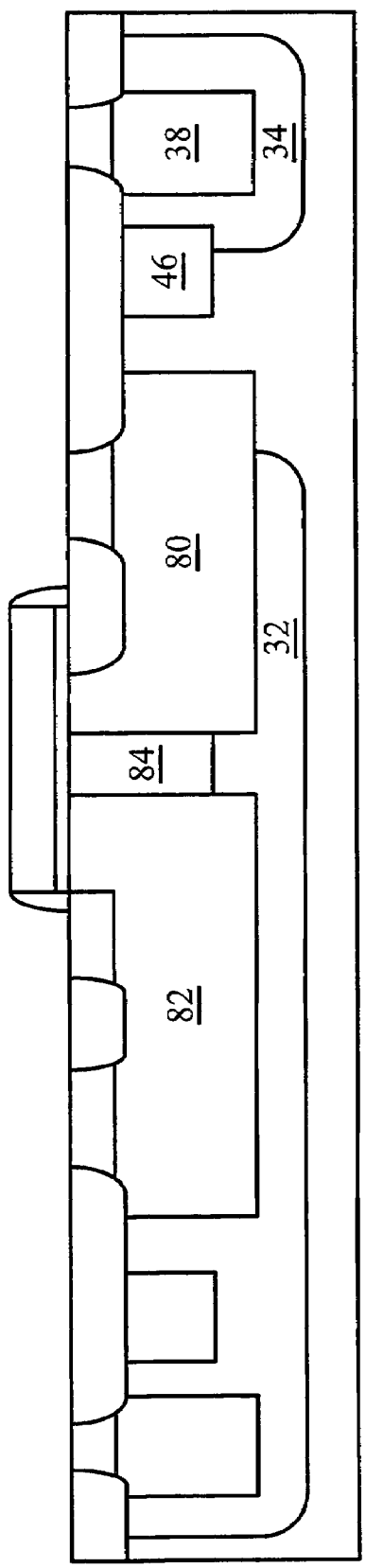
FIG. 11 illustrates a symmetric HVPMOS device.

The previously illustrated embodiments have asymmetric structures, wherein source and drain regions are in well regions with different conductivity types. FIG. 11 illustrates a HVPMOS embodiment having a symmetric structure, wherein the HVPMOS device includes two LVPW regions 80, 82 and an LVNW 84 region therebetween. Similar to the embodiment illustrated in FIG. 8, DNW regions 32 and 34 are separated from each other in order to increase breakdown voltage.

Figure 12:
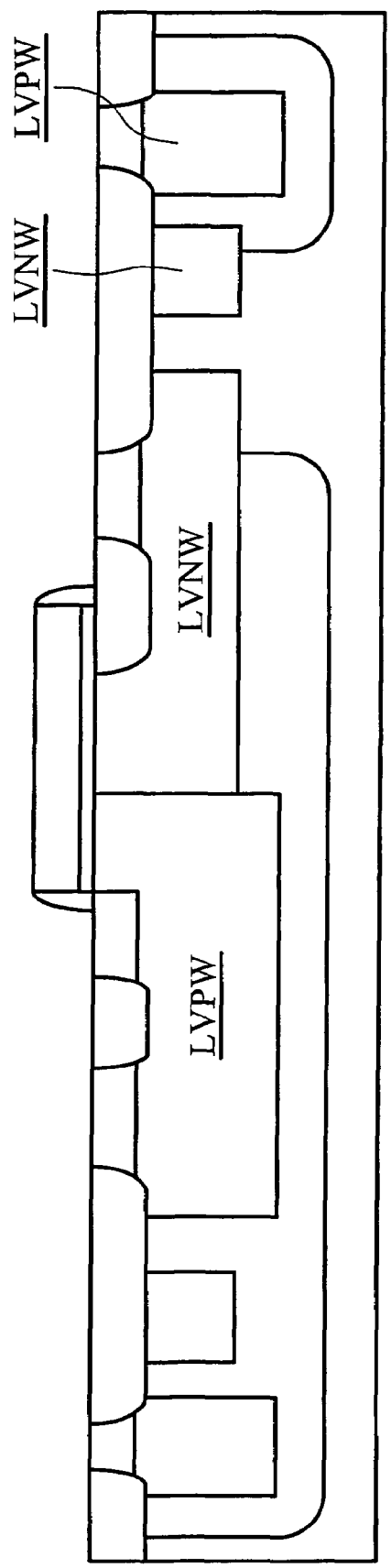
FIG. 12 illustrates an HVNMOS device.

Although the preferred embodiments illustrate the formation of a HVPMOS device, one skilled in the art will realize the respective formation steps for forming HVNMOS devices, with the conductivity type of n-well regions 36, 38 and 40, p-well regions 44, 46 and 48, and source/drain regions 58 and 60, etc., reversed (refer to FIG. 8). An exemplary illustrative embodiment is shown in FIG. 12. It should also be appreciated that HVMOS devices have various different layouts. However, the concept of the present invention may still be applied. Similarly, a symmetric HVNMOS device may be formed by reversing the conductivity types of the doped regions in FIG. 11.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
    a substrate;
    a first well region of a first conductivity type overlying the substrate;
    a second well region of a second conductivity type opposite the first conductivity type overlying the substrate and laterally adjoining the first well region;
    a third well region of the second conductivity type adjacent the first well region, wherein the second and the third well regions are spaced apart from each other;
    a first deep well region of the second conductivity type underlying at least portions of the first and the second well regions;
    a second deep well region of the second conductivity type underlying the third well region, wherein the second deep well region encloses at least portions of sidewalls and bottom of the third well region, and wherein the first and the second deep well regions are spaced apart by a spacing;
    an insulation region in a portion of the first well region and extending from a top surface of the first well region into the first well region;
    a gate dielectric extending from over the first well region to over the second well region, wherein the gate dielectric has a portion over the insulation region; and
    a gate electrode on the gate dielectric.

2. The semiconductor structure of claim 1, wherein the first conductivity type is p-type and the second conductivity type is n-type.

3. The semiconductor structure of claim 1, wherein the first conductivity type is n-type and the second conductivity type is p-type.

4. The semiconductor structure of claim 1, wherein a first impurity concentration of second conductivity type impurities in the spacing is lower than a second impurity concentration of second conductivity type impurities in the first and the second deep well region.

5. The semiconductor structure of claim 4, wherein the first impurity concentration is lower than the second impurity concentration by greater than about one order.

6. The semiconductor structure of claim 1, wherein each of the first well region, the second well region, the third well region, the first deep well region and the second deep well region is a continuous well region having a substantially uniform impurity concentration.

7. The semiconductor structure of claim 1 further comprising a fourth well region of the first conductivity type between the first and the third well regions, wherein the fourth well region is spaced apart from the first and the third well regions.

8. The semiconductor structure of claim 7, wherein the fourth well region adjoins the second deep well region.

9. The semiconductor structure of claim 7, wherein the fourth well region is spaced apart from the second deep well region.

10. The semiconductor structure of claim 1, wherein the first and the second well regions are low-voltage well regions.

11. The semiconductor structure of claim 1 further comprising a fourth well region of the first conductivity on an opposite side of the second well region than the first well region, wherein the well region adjoins the second well region, and wherein the gate dielectric extends over the fourth well region.

12. The semiconductor structure of claim 1 further comprising:
a first source/drain region in the first well region and adjacent the insulation region; and
a second source/drain region in the second well region and adjacent the gate dielectric.

13. A semiconductor structure comprising:
a substrate;
a first well region of a first conductivity type overlying the substrate;
a second well region of a second conductivity type opposite the first conductivity type overlying the substrate and laterally adjoining the first well region;
a third well region of the second conductivity type adjacent the first well region, wherein the second and the third well regions are spaced apart from each other by a spacing;
a deep well region of the second conductivity type underlying the first, the second and the third well regions, wherein a portion of the deep well region directly underlying the spacing has a first impurity concentration, and wherein portions of the deep well region directly underlying the first and the second well regions have a second impurity concentration, and wherein the first impurity concentration is less than the second impurity concentration;
an insulation region in a portion of the first well region and extending from a top surface of the first well region into the first well region;
a gate dielectric extending from over the first well region to over the second well region, wherein the gate dielectric has a portion over the insulation region; and
a gate electrode on the gate dielectric.

14. The semiconductor structure of claim 13, wherein the first conductivity type is p-type and the second conductivity type is n-type.

15. The semiconductor structure of claim 13, wherein the second impurity concentration is greater than the first impurity concentration by greater than about one order.

16. A semiconductor structure comprising:
a semiconductor substrate;
a first low-voltage p-well (LVPW) region overlying the substrate;
a first low-voltage n-well (LVNW) region overlying the substrate and laterally adjoining the first LVPW region;
a second LVNW region overlying the substrate and encircling the first LVNW region and the first LVPW region, wherein the second LVNW region is spaced apart from the first LVNW region and the first LVPW region;
a first deep n-well (DNW) region underlying at least portions of first LVNW region and the first LVPW region;
a second DNW region underlying the second LVNW region and laterally spaced apart from the first DNW region;
an insulation region in the first LVPW region, the insulation region having a top surface substantially level with a top surface of the first LVPW region;
a gate dielectric extending from over the insulation region to over the first LVNW region;
a gate electrode on the gate dielectric;
a drain region in the first LVPW region and adjacent the insulation region; and
a source region in the first LVNW region and adjacent the gate dielectric.

17. The semiconductor structure of claim 16, wherein each of the first and the second deep well regions is a continuous region having a substantially uniform n-type impurity concentration.

18. The semiconductor structure of claim 16, wherein a spacing between the first and the second DNW region has diffused n-type impurities with a first n-type impurity concentration, and wherein the first and the second DNW regions have a second n-type impurity concentration, and wherein the first and the second impurity concentrations have a difference greater than about one order.

19. The semiconductor structure of claim 16 further comprising a second LVPW region between and spaced apart from the first LVPW region and the second LVNW region.

20. A method for forming a semiconductor structure, the method comprising:
providing a substrate;
forming a first well region of a first conductivity type overlying the substrate;
forming a second well region of a second conductivity type overlying the substrate and laterally adjoining the first well region, wherein the second conductivity type is opposite the first conductivity type;
forming a third well region of the second conductivity type adjacent the first well region, wherein the second and the third well regions are spaced apart from each other;
forming a first deep well region of the second conductivity type underlying at least portions of the first and the second well regions;
forming a second deep well region of the second conductivity type underlying the third well region, wherein the first and the second deep well regions are spaced apart by a spacing;
forming an insulation region in a portion of the first well region and extending from a top surface of the first well region into the first well region;

forming a gate dielectric extending from over the first well region to over the second well region, wherein the gate dielectric has a portion over the insulation region; and forming a gate electrode on the gate dielectric.

21. The method of claim 20, wherein the second and the third well regions are simultaneously formed, and wherein the first and the second deep well regions are simultaneously formed.

22. The method of claim 20, wherein the first well region is simultaneously formed with a first low-voltage well region of a first low-voltage MOS device, and the second and the third well regions are simultaneously formed with a second low-voltage well region of a second low-voltage MOS device.

23. The method of claim 20 further comprising an annealing process after the steps of forming the first and the second deep well regions, wherein impurities in the first and the second deep well regions are diffused into the spacing, and wherein an impurity concentration of diffused atoms from the first and the second deep well regions have a first impurity concentration lower than a second impurity concentration in the first and the second deep well regions.

24. The method of claim 23, wherein the first impurity concentration is lower than the second impurity concentration by greater than about one order.

* * * * *